(12) United States Patent
Kohara

(10) Patent No.: US 9,231,804 B2
(45) Date of Patent: Jan. 5, 2016

(54) DIGITAL BROADCAST TRANSMITTING DEVICE AND EXCITER

(71) Applicant: Kabushiki Kaisha Toshiba, Minato-ku (JP)

(72) Inventor: Norikazu Kohara, Hachiouji (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/570,769

(22) Filed: Dec. 15, 2014

(65) Prior Publication Data

US 2015/0098525 A1    Apr. 9, 2015

Related U.S. Application Data

(63) Continuation of application No. PCT/JP2012/007851, filed on Dec. 7, 2012.

(30) Foreign Application Priority Data

Jun. 15, 2012    (JP) .................................. 2012-136416

(51) Int. Cl.
*H04L 27/36* (2006.01)
*H04L 27/04* (2006.01)
*H03G 3/30* (2006.01)

(52) U.S. Cl.
CPC .............. *H04L 27/04* (2013.01); *H03G 3/3042* (2013.01)

(58) Field of Classification Search
None
See application file for complete search history.

(56) References Cited

U.S. PATENT DOCUMENTS

| 5,423,082 | A  | * | 6/1995  | Cygan et al. ................... 455/126 |
| 5,469,105 | A  | * | 11/1995 | Sparks .......................... 330/129 |
| 5,507,017 | A  | * | 4/1996  | Whitmarsh et al. .......... 455/126 |
| 5,574,992 | A  | * | 11/1996 | Cygan et al. ................... 455/126 |
| 6,693,956 | B1 | * | 2/2004  | Yamamoto ..................... 375/219 |
| 6,941,118 | B2 | * | 9/2005  | Yamamoto ..................... 455/126 |
| 8,964,892 | B2 | * | 2/2015  | Hansen et al. ................ 375/297 |

FOREIGN PATENT DOCUMENTS

JP    10-41769 A    2/1998

OTHER PUBLICATIONS

International Search Report issued on Mar. 12, 2013 in PCT/JP2012/007851 (with English Translation).

* cited by examiner

*Primary Examiner* — Adolf Dsouza
(74) *Attorney, Agent, or Firm* — Oblon, McClelland, Maier & Neustadt, L.L.P.

(57) ABSTRACT

A digital broadcast transmitting device and an exciter have an AGC function. In a level adjusting unit which receives an input of a baseband digital signal from a modulation processing unit, a comparator generates an error signal from a difference between a level signal obtained by digitizing a feedback signal from a power amplifier by A/D converter and a reference voltage generated by a reference generating unit, and an AGC multiplier/divider carries out digital multiplying/dividing coefficient to the baseband digital signal with or by a gain coefficient such that the error signal becomes 0. Thereby, AGC which controls transmission output from the power amplifier at a fixed level is carried out.

6 Claims, 12 Drawing Sheets

| OUTPUT SETTING LEVEL | α83 | Vr (AVERAGE LEVEL) |
|---|---|---|
| −6dB | 0.25 | 0.5 |
| −3dB | 0.5 | 1 |
| Adbm | 1 | 2 |
| +3dB | 2 | 4 |
| +6dB | 4 | 8 |

FIG. 2

PRIOR ART

DIGITAL BROADCAST TRANSMITTING DEVICE AND EXCITER

CROSS-REFERENCE TO RELATED APPLICATIONS

This application is based upon and claims the benefit of the priority from the prior Japanese Patent Application No. 2012-136416 filed on Jun. 15, 2012, the entire contents of which are incorporated herein by reference. This application is a continuation application of International Application No. PCT/JP2012/007851 filed on Dec. 7, 2012.

FIELD

The present embodiment relates to a digital broadcast transmitting device and an exciter.

BACKGROUND

A digital broadcast transmitter performs AGC (Automatic Gain Control) which controls an output level at a fixed level by extracting and monitoring part of transmission outputs, performing automatic adjustment which carries out feedback controlling of a gain of the amplifier such that this monitoring signal meets a predetermined AGC reference value, such that a transmission output level settles accurately in an predetermined level even when an amplifier of the transmitter is influenced by a temperature or temporal changes.

FIG. 7 is a functional block diagram for explaining a configuration of the digital broadcast transmitting device. The digital broadcast transmitting device which transmits broadcast radio waves has an exciter ex (EX) which receives an input of a TS (Transport Stream) signal from a net signal and the like from a studio device, a server and an affiliated station and converts the TS signal into a radio frequency signal, and a power amplifier PA which amplifies the converted radio frequency signal to a predetermined signal level and outputs the radio frequency signal from an antenna.

For digital broadcast, the power amplifier PA having high linearity and a wide dynamic range is used to transmit a quadrature modulation wave, i.e., an OFDM modulation wave, and the AGC function performs important operation compensation. However, the AGC function is performed by analog circuit processing of using a differential amplifier to compare a direct current signal obtained by detecting and rectifying a feedback signal as an output level signal and the AGC reference value which is a direct current voltage, and using a variable attenuator or the like to adjust an output of a difference signal as an error signal.

In some cases, test operations of the digital broadcast transmitting device are performed at a lower test output than a steady operation output upon a maintenance operation or the like. In this case, the above direct current AGC reference value is fixed. Therefore, when test operations are carried out in this state, the AGC function performs an operation of increasing a gain of an amplifier or decreasing an attenuation amount to increase an output, and therefore it is necessary to adjust the reference value.

FIG. 8 is a functional block diagram of the exciter ex of the digital broadcast transmitting device in which the AGC function is provided to the conventional exciter and which controls an output of the power amplifier PA at a fixed level.

In FIG. 8, the exciter ex has a digital processing unit dp which converts a broadcast TS signal to be input, into a radio frequency signal, and an analog processing unit ap which converts the converted radio frequency signal into a modulation signal of a broadcast radio wave format, applies AGC to the modulation signal to adjust the modulation signal at a predetermined signal level and outputs the modulation signal.

FIG. 9 is a functional block diagram of an AGCAmp 52 included in the analog processing unit ap. The analog processing unit ap outputs to the power amplifier PA a signal which is set to a predetermined level by an output monitoring unit 50 and which passes through a VATT (variable attenuator) 60. Further, a DET 5 receives an input of a feedback signal of a transmission radio wave from the power amplifier PA, detects and rectifies the feedback signal, converts the feedback signal into a direct current detection level signal and outputs the detection level signal to the AGCAmp 52. The AGCAmp 52 has a reference voltage source r, compares a reference voltage and the detection level signal, and outputs a VATT 60 control signal to minimize a difference between the reference voltage and the detection level signal.

A test operation is carried out by, for example, increasing the attenuation amount of the VATT 60 by 3 dB and decreasing a transmission output, and reducing the attenuation amount of a VATT 61 by 3 dB to match the detection level signal with the reference voltage. By so doing, it is possible to perform a required AGC operation even upon test operations. A great number of devices including relay devices are installed for a digital broadcast transmitting device. However, the digital broadcast transmitting device needs to save a space, save power, and easily adjust and set an output at a limited transmission space of a remote station.

However, the VATTs 60 and 61 which are analog circuit functional parts which carry out the AGC function, and therefore a device scale becomes large. In addition, an amplifying unit 4 suppresses an output at a fixed level, and therefore consumes unnecessary power. Further, when a plurality of levels needs to be set for test operations, adjusting and setting the VATTs 60 and 61 are bothersome. Meanwhile, in some cases, an output of a digital broadcast transmitting device is set to enable adjustment of coverage according to conditions of a place at which a transmitter is installed. Therefore, there is a problem that it is necessary to provide a reference voltage according to respective outputs or provide multiple types of default values of the VATT 61.

BRIEF DESCRIPTION OF DRAWINGS

FIG. 2 is a view illustrating information output from a table converting/adjusting unit according to an output setting.

DETAILED DESCRIPTION

Figure 1A:
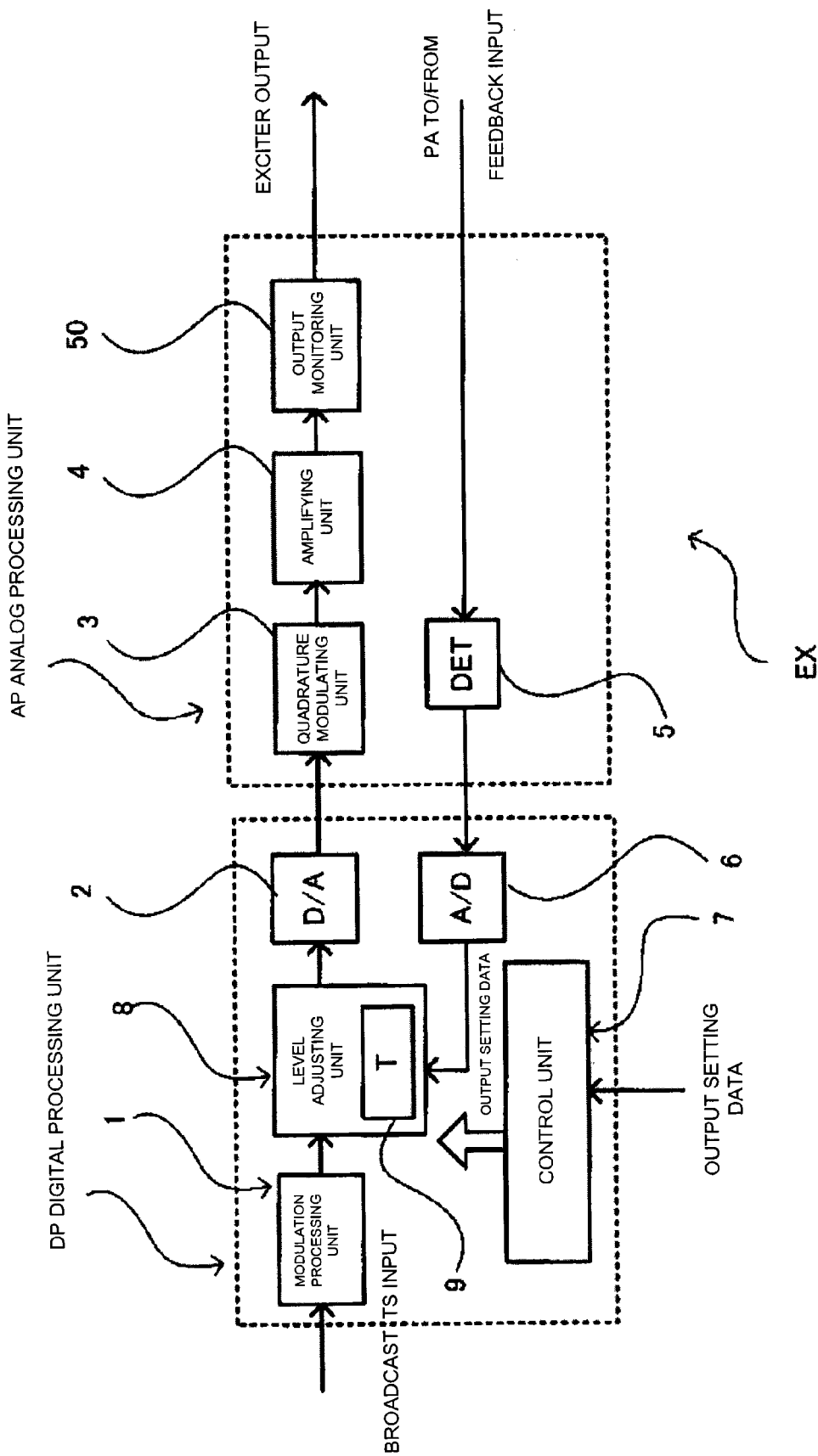
FIG. 1A is a functional block diagrams of an exciter according to a first embodiment.

A conventional digital broadcast transmitting device uses an attenuator which adjusts an extra output, and therefore has a problem that a device scale becomes large, power is consumed and, in addition, adjusting and setting multiple output levels are bothersome.

In light of the above situation, a digital broadcast transmitting device according to the present embodiment is a digital broadcast transmitting device which converts a broadcast TS signal to be input, into a signal of a digital broadcast radio wave format which is subjected to quadrature modulation, supplies the signal to a power amplifier, and transmits from an antenna a broadcast radio signal amplified by the power amplifier, and which includes: a power amplifier which outputs part of the transmitted broadcast radio signal as a feedback signal; a controlling means which sends out output setting data for setting an output level of the broadcast radio wave; an A/D converter means which receives an input of the feedback signal, and outputs the input feedback signal as an A/D-converted level signal; a converting means which converts the broadcast TS signal to be input, into a baseband digital signal, and outputs the baseband digital signal; a level adjusting means which includes reference generating means which receives an input of the level signal, the baseband digital signal and the output setting data, and generates and outputs a reference voltage corresponding to the output setting data, a comparing means which receives an input of the reference voltage and the level signal, and outputs a difference between the reference voltage and the level signal as an error signal, an AGC multiplying/dividing means which receives an input of the error signal and the baseband digital signal, multiplies or divides the baseband digital signal with or by an internal gain coefficient such that the error signal becomes 0, converts a multiplication/division result into an AGC baseband signal, and outputs the AGC baseband signal, and an output adjusting means which multiplies the AGC baseband digital signal with an output gain coefficient based on the output setting data, converts a multiplication result into a digital signal corresponding to the output level of the broadcast radio wave, and outputs the digital signal; and an exciter which includes D/A converter means which D/A-converts the digital signal output from the level adjusting means, into a baseband analog signal, and outputs the baseband analog signal, and an analog processing unit which performs quadrature modulation on the D/A-converted signal to be input, amplifies the D/A-converted signal, converts the signal into an exciter signal which is a high frequency signal of a broadcast radio wave format, and outputs the exciter signal.

Further, an exciter of a digital broadcast transmitting device according to the present embodiment is an exciter of a digital broadcast transmitting device which converts a broadcast TS signal to be input, into a signal of a digital broadcast radio wave format which is subjected to quadrature modulation, supplies the signal to a power amplifier, transmits from an antenna a broadcast radio signal amplified by the power amplifier, and receives an input of part of the transmitted broadcast radio signal as a feedback signal, and which includes: a controlling means which sends out output setting data for setting an output level of an exciter signal corresponding to an output level of the broadcast radio wave; an A/D converter means which receives an input of the feedback signal, and outputs the input feedback signal as an A/D-converted level signal; a converting means which converts the broadcast TS signal to be input, into a baseband digital signal, and outputs the baseband digital signal; a level adjusting means which includes a reference generating means which receives an input of the level signal, the baseband digital signal and the output setting data, and generates and outputs a reference voltage corresponding to the output setting data, a comparing means which receives an input of the reference voltage and the level signal, and outputs a difference between the reference voltage and the level signal as an error signal, an AGC multiplying/dividing means which receives an input of the error signal and the baseband digital signal, multiplies or divides the baseband digital signal with or by an internal gain coefficient such that the error signal becomes 0, converts a multiplication/division result into an AGC baseband signal, and outputs the AGC baseband signal, and an output adjusting means which multiplies the AGC baseband digital signal with an output gain coefficient based on the output setting data, converts a multiplication result into a digital signal corresponding to the output level of the broadcast radio wave, and outputs the digital signal; a D/A converter means which D/A-converts the digital signal output from the level adjusting means, into a baseband analog signal, and outputs the baseband analog signal; and an analog processing unit which converts the D/A-converted signal to be input, into an exciter signal which is subjected to quadrature modulation and amplified, and outputs the exciter signal.

According to one embodiment, it is possible to provide a digital broadcast transmitting device and an exciter which have an AGC function which saves power, saves a space and easily sets various types of output levels.

The digital broadcast transmitting device according to the following embodiments will be described with reference to the drawings.

FIG. 1A is a functional block diagrams of an exciter according to a first embodiment. In FIG. 1A, an exciter EX has a digital processing unit DP which converts a broadcast TS signal to be input, into a baseband digital signal, performs AGC processing on the baseband digital signal, and further converts the baseband digital signal into an analog baseband signal, and an analog processing unit AP which performs quadrature modulation on the converted analog baseband signal, converts the analog baseband signal into a radio frequency signal of a broadcast radio wave format, and outputs the radio frequency signal as an exciter signal of a predetermined signal level to a power amplifier PA.

Figure 7:
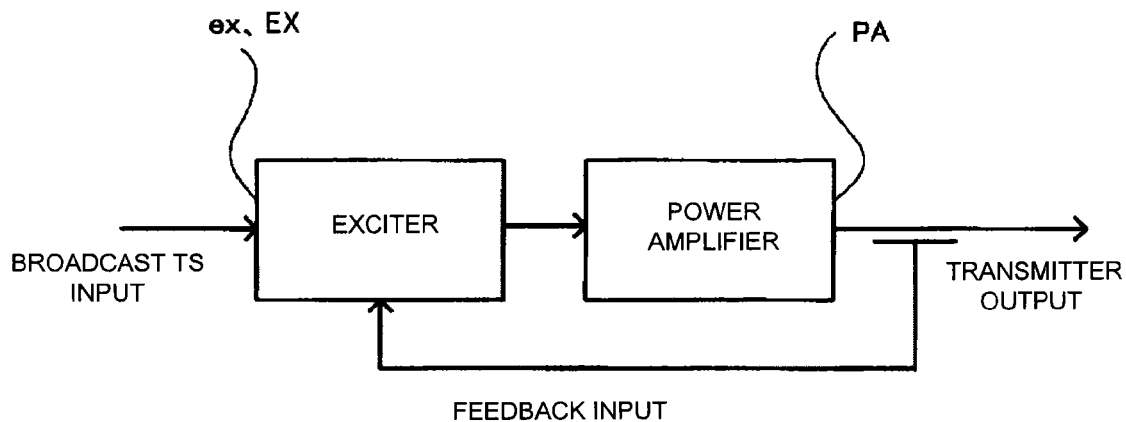
FIG. 7 is a functional block diagram for explaining a configuration of a conventional digital broadcast transmitting device.
Figure 9:
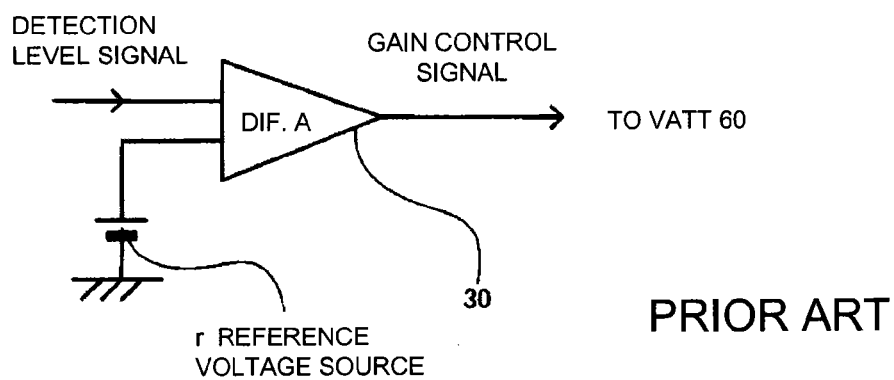
FIG. 9 is a functional block diagram of an AGCAmp included in a conventional analog processing unit.

The analog processing unit AP has a quadrature modulating unit 3 which performs OFDM modulation on an analog signal input from the digital processing unit DP, an amplifying unit 4 which amplifies the signal which is subjected to OFDM modulation, to a predetermined output level, and outputs the signal as an exciter signal, an output monitoring unit 50 which monitors a level of the exciter signal from the amplifying unit 4, and outputs the level to the power amplifier PA (see FIG. 7), and a detector (DET) 5 which detects and rectifies a feedback input signal from the output of the power amplifier PA, and outputs the feedback input signal as a level signal. A feedback signal is extracted from part of a transmission output by a coupler or the like in a connection system to an antenna (not illustrated).

The digital processing unit DP has a control unit 7, a modulation processing unit 1, a level adjusting unit 8, a digital-to-analog (D/A) converter (D/A) 2 and an analog-to-digital (A/D) converter (A/D) 6 which are connected with bus lines. The modulation processing unit 1 converts a broadcast TS signal to be input, into a baseband digital signal and outputs the baseband digital signal to the level adjusting unit 8. The level adjusting unit 8 multiplies the baseband digital signal with a gain coefficient based on output setting data input from the control unit 7, multiplies AGC processing with the gain coefficient and outputs to the D/A 2 a digital signal whose level is adjusted.

The D/A 2 converts the baseband digital signal whose level is adjusted, into an analog signal, and outputs the analog signal. The A/D 6 digitally converts a signal which is detected and rectified by the DET 5 described below and received as a level signal, and outputs a digitally converted signal to the level adjusting unit 8 of the digital processing unit DP. The control unit 7 receives an input of a setting value of power transmitted from the power amplifier PA, as output setting data from an information terminal or the like through a switch, a dial and I/O means which is not illustrated. This output setting data is input to the level adjusting unit 8.

Figure 1B:
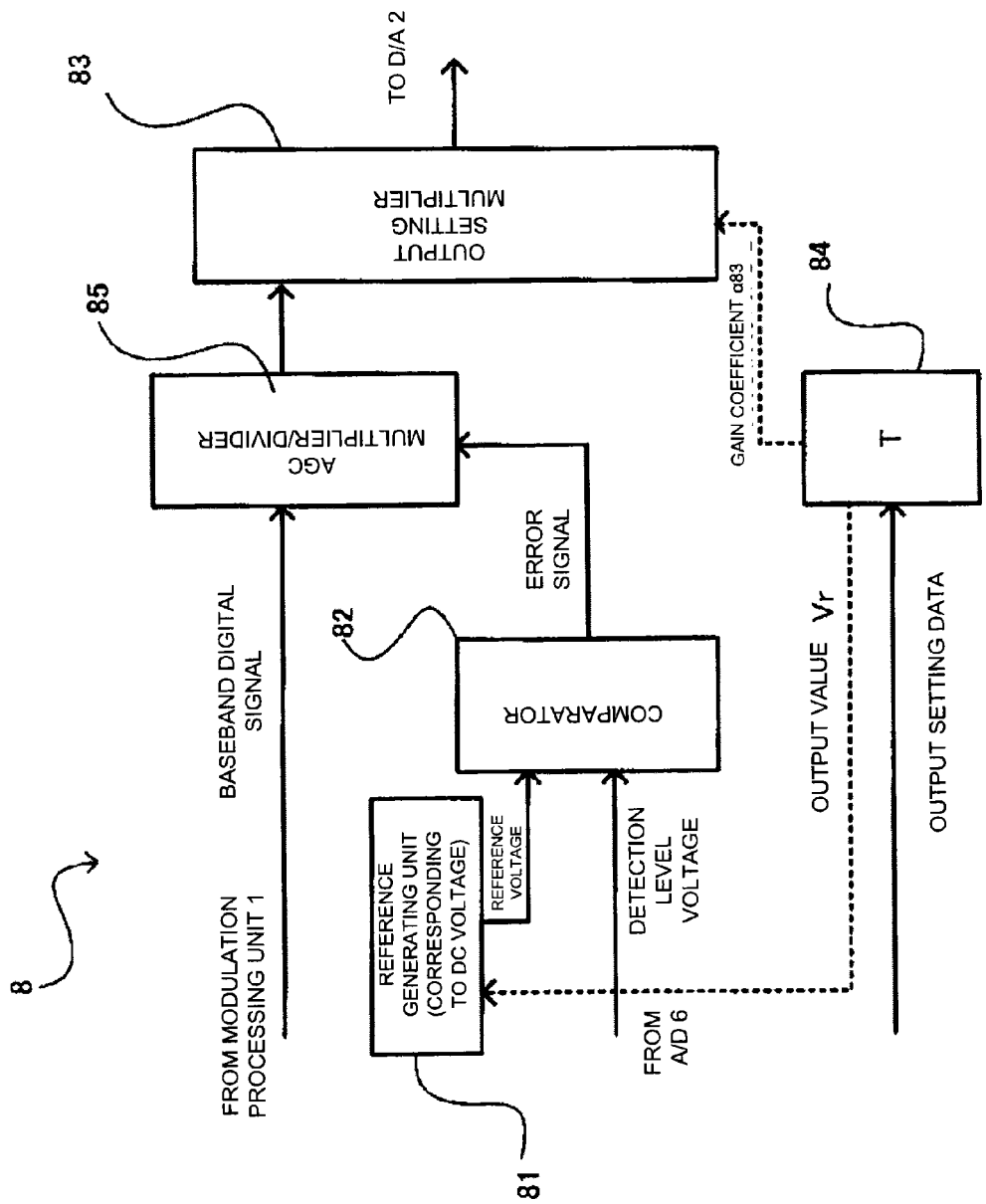
FIG. 1B is a functional block diagram of a level adjusting unit in FIG. 1A.

FIG. 1B is a functional block diagram for explaining an operation of the level adjusting unit 8. In FIG. 1B, the level adjusting unit 8 has a reference generating unit 81, a comparator 82, an output setting multiplier 83, a table converting/adjusting unit 84 and an AGC multiplier/divider 85 as functional components.

The reference generating unit 81 is a functional unit which outputs a voltage corresponding to a conventional AGC reference voltage. The comparator 82 corresponds to a conventional differential amplifier, and outputs to the AGC multiplier/divider 85 an error signal obtained by comparing an A/D-converted level signal (detection level voltage) and a reference voltage (Vr in this case).

The AGC multiplier/divider 85 multiplies or divides the baseband digital signal input from the modulation processing unit 1, with or by a gain coefficient for adjusting to reduce an error signal according to the polarity and a level of this error signal, and outputs a resultant baseband digital signal to the D/A 2.

The table converting/adjusting unit 84 uses output setting data input from the control unit 7 as a reference standard, and outputs information for obtaining output of the power amplifier PA that is set in accordance with the output setting data.

Hence, the table converting/adjusting unit 84 outputs a gain coefficient α83 for adjusting an amplitude value of the baseband digital signal in the output setting multiplier 83, and Vr for specifying a reference voltage for comparing with a level voltage in the comparator 82.

FIG. 2 is an example of a view illustrating a relationship between the gain coefficient α83 and Vr output by the table converting/adjusting unit 84 according to the output setting.

In FIG. 2, the setting output is set in steps of 3 dB units, and the reference voltage Vr and the gain coefficient α83 of an amplification gain for obtaining a transmission output are set as a direct proportional relationship to the setting output.

In this regard, the level adjusting unit 8 including the table converting/adjusting unit 84 is expressed as an active functional unit. However, the table converting/adjusting unit 84 may be included in the control unit 7 as table data of constants written in a memory, and the level adjusting unit 8 may be realized by a computing function that the control unit 7 executes to data input and output through bus lines.

Figure 8:
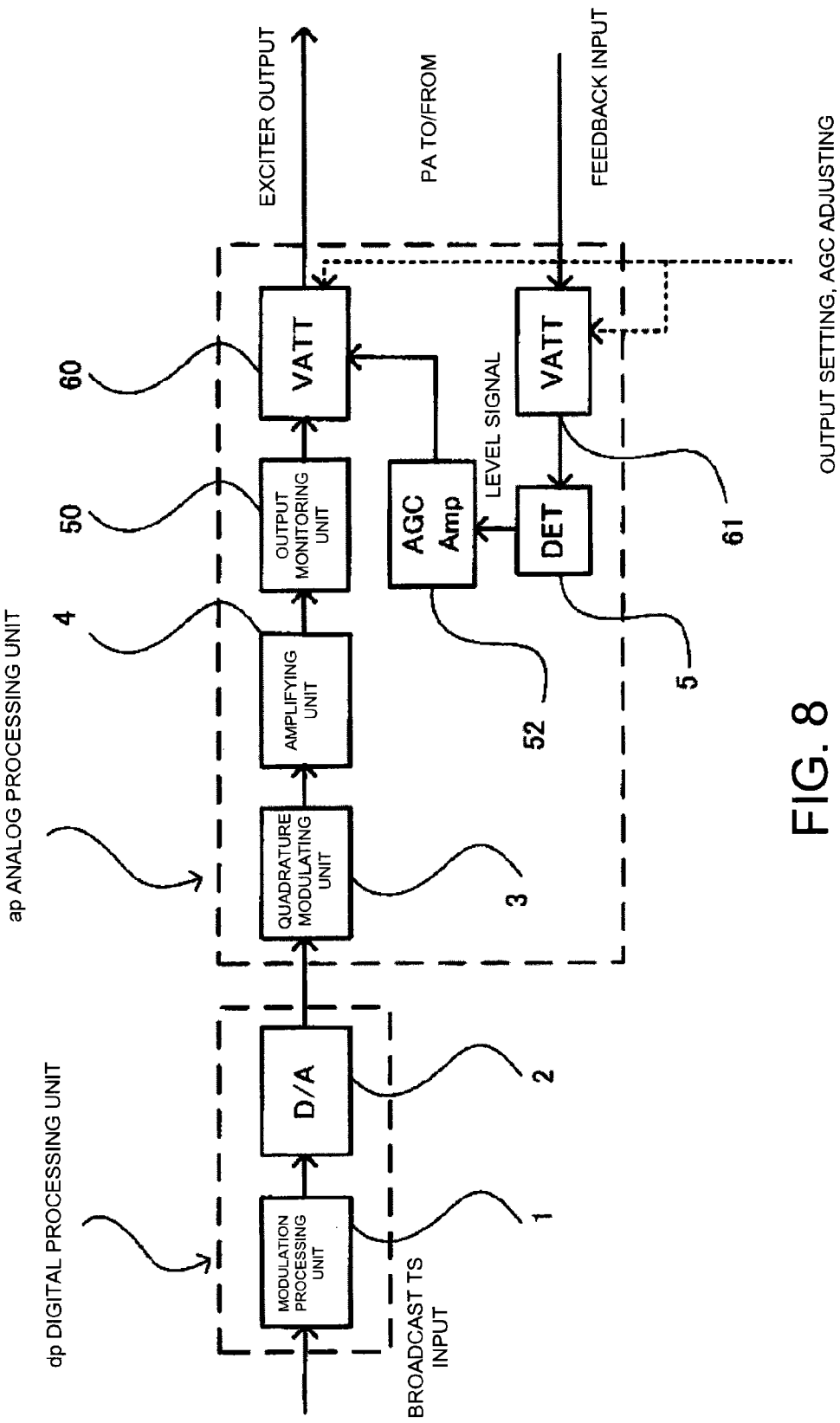
FIG. 8 is a functional block diagram of an exciter ex of a conventional digital broadcast transmitting device.

In this first embodiment, VATTs 60 and 61 included in an analog processing unit ap of a conventional exciter illustrated in FIG. 8 are omitted. Compared to the conventional example, the A/D 6 and the level adjusting unit 81 are added to the digital processing unit. However, the level adjusting unit 81 is a virtual physical entity which performs computation processing, and therefore a space disadvantage is not provided.

Meanwhile, the A/D 6 is a component added as hardware. However, the A/D 6 is configured using a smaller chip than those of the VATTs 60 and 61 and therefore provides little disadvantage. Consequently, according to the present embodiment, a space is saved in total compared to that of the conventional exciter.

Further, the amplitude of a baseband digital signal is changed according to a setting output, and therefore the amplifying unit 4 also provides an output with required power and, even when the output setting is at a low level, an attenuator does not consume wasteful power unlike the conventional example. Furthermore, it is possible to easily adjust a reference voltage and an AGC gain by providing multiple setting conditions to the table converting/adjusting unit (T) 84. Consequently, it is possible to provide an advantage that not only test operation but a transmitter based on the same specification can set output setting levels suitable for multiple installation conditions.

Figure 3A:
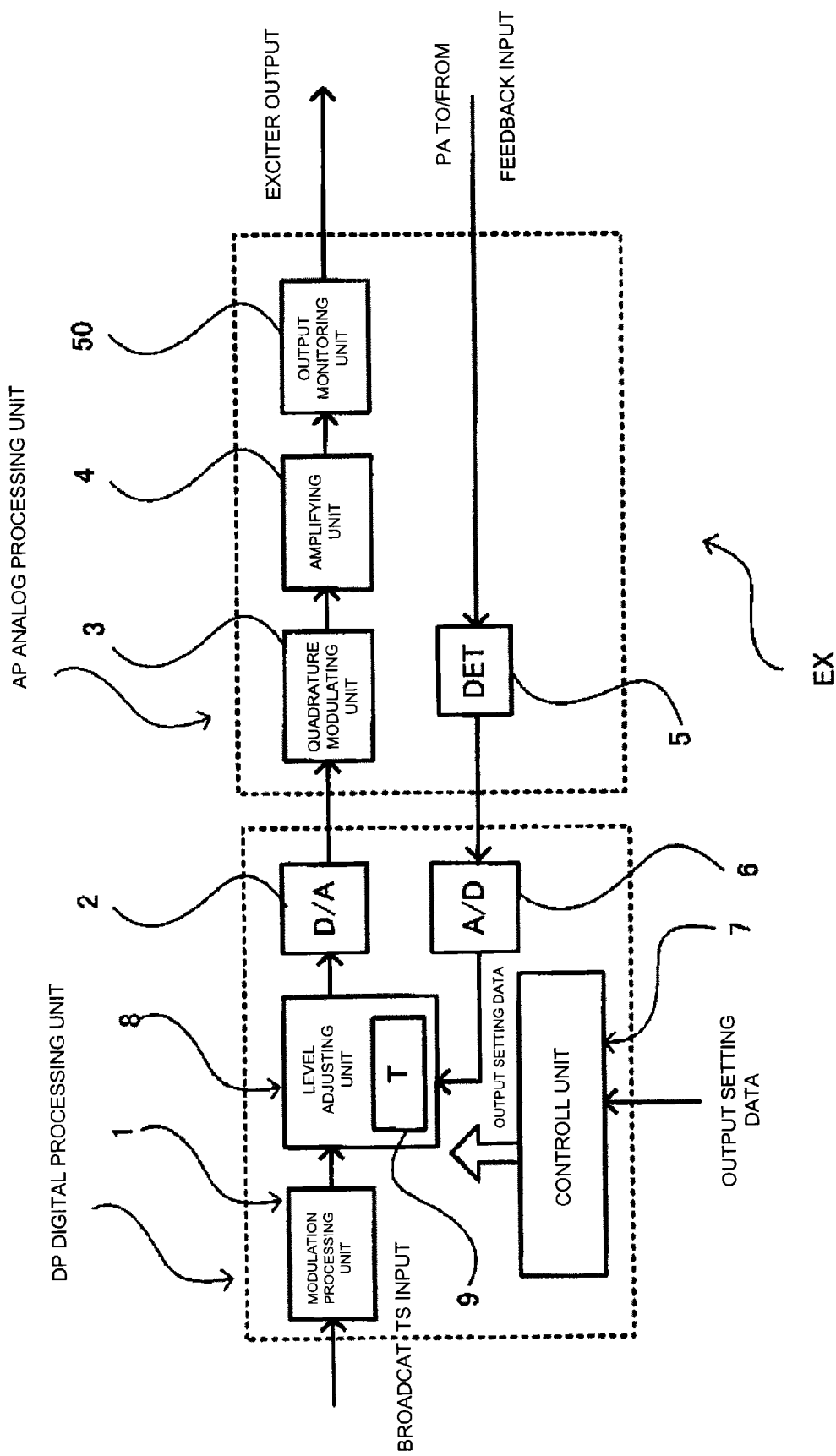
FIG. 3A is a functional block diagrams of an exciter showing a second embodiment.
Figure 3B:
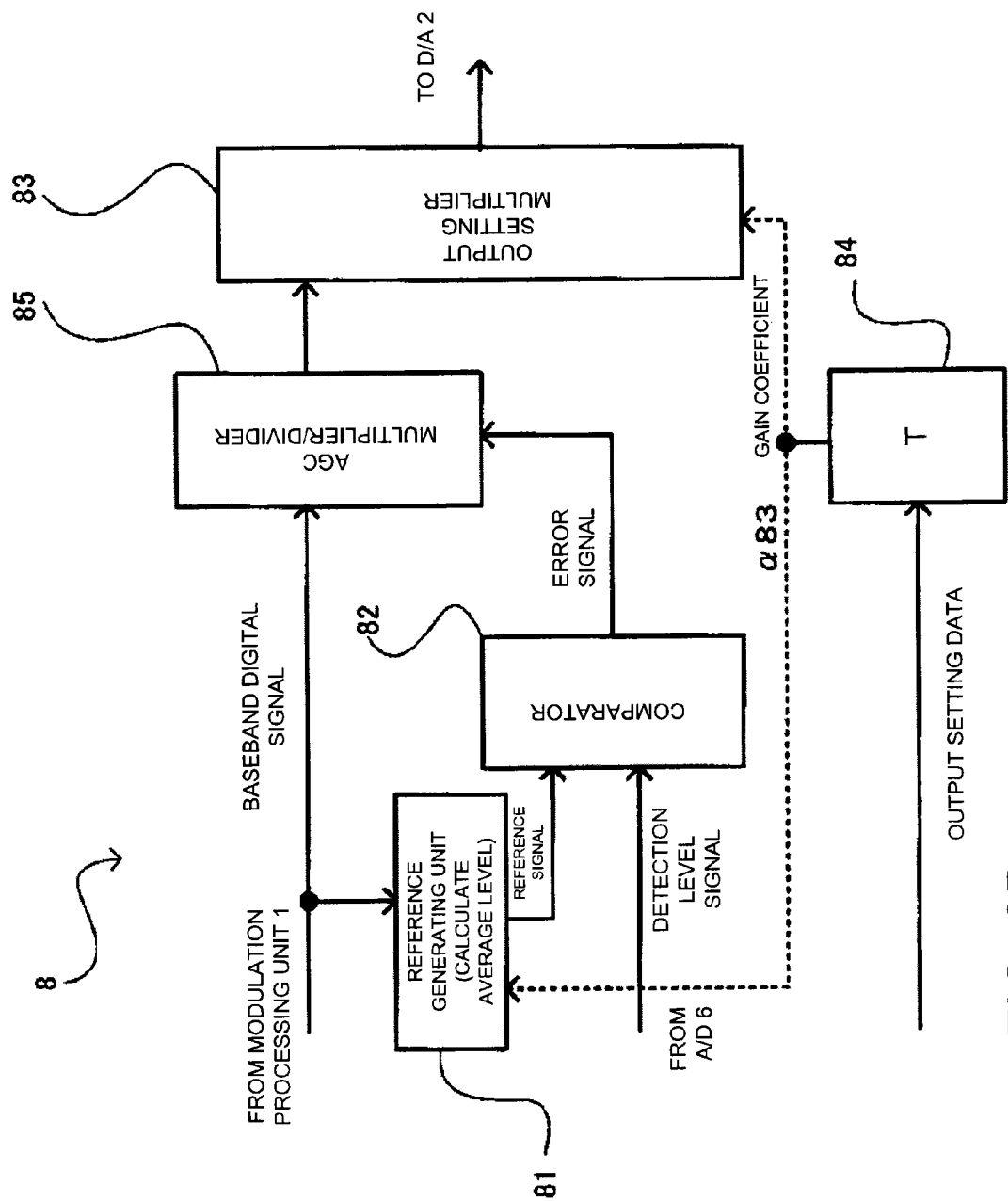
FIG. 3B is a functional block diagram of a level adjusting unit in FIG. 3A.

FIG. 3A is a functional block diagram of an exciter showing the second embodiment, and FIG. 3B is a functional block diagram for explaining an operation of a level adjusting unit 8 of an exciter according to the second embodiment. The second embodiment is the same as the first embodiment except for a configuration and the operation of the level adjusting unit 8 described below, and therefore overlapping description will be omitted.

In FIG. 3B, instead of outputting a fixed reference voltage, a reference generating unit 81 receives an input of a baseband digital signal from a modulation processing unit 1, calculates an average level of the amplitude of the baseband digital signals, and the average level and a detection level voltage of a feedback input are compared. This method can obtain an average level corresponding to an actual waveform and pattern of a signal to be transmitted, and therefore provides an advantage of providing more accurate AGC.

In this case, the average level also changes likewise as a reference voltage proportionally changes according to an output setting level in the first embodiment.

Figure 4A:
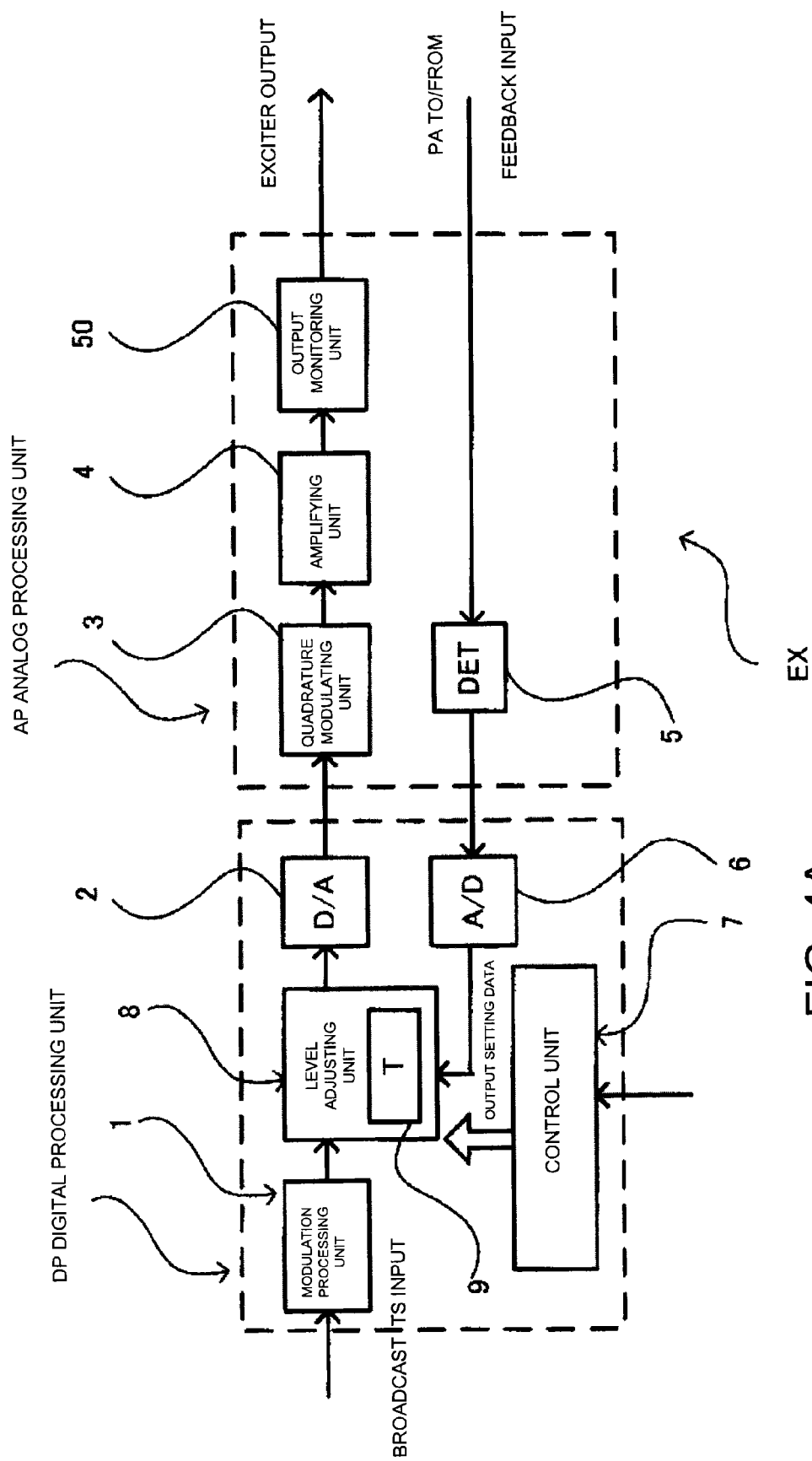
FIG. 4A is a functional block diagrams of an exciter showing a modified example of the second embodiment.
Figure 4B:
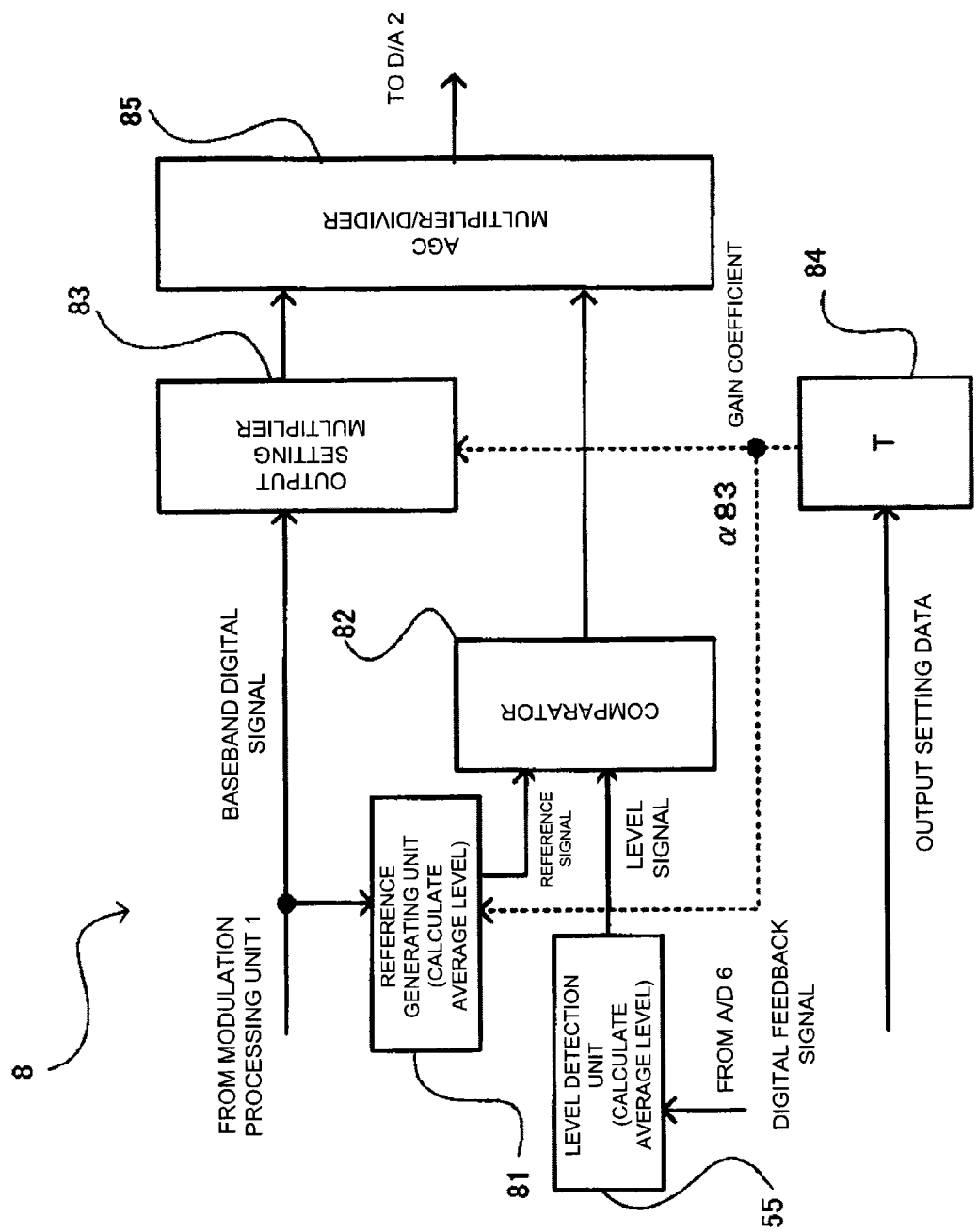
FIG. 4B is a functional block diagram of a level adjusting unit in FIG. 4A.

FIG. 4A is a functional block diagram of an exciter according to a modified example of the second embodiment, and FIG. 4B is a functional block diagram for explaining an operation of a level adjusting unit 8 of the exciter according to the modified example. According to this modified example of this embodiment, the level adjusting unit 8 is configured to input to an output setting multiplier 83 a baseband digital signal from a modulation processing unit 1, and set an output level. Differences from the second embodiment are that the signal whose level is set and an error signal from a comparator 82 are input to an AGC multiplier/divider 83, and a feedback input level also changes according to output setting conditions and therefore a reference voltage level is also adjusted accordingly. However, the present modified example is basically the same as the second embodiment except for these. Rearranging this AGC processing order is applicable to the first embodiment likewise the second embodiment.

Figure 5A:
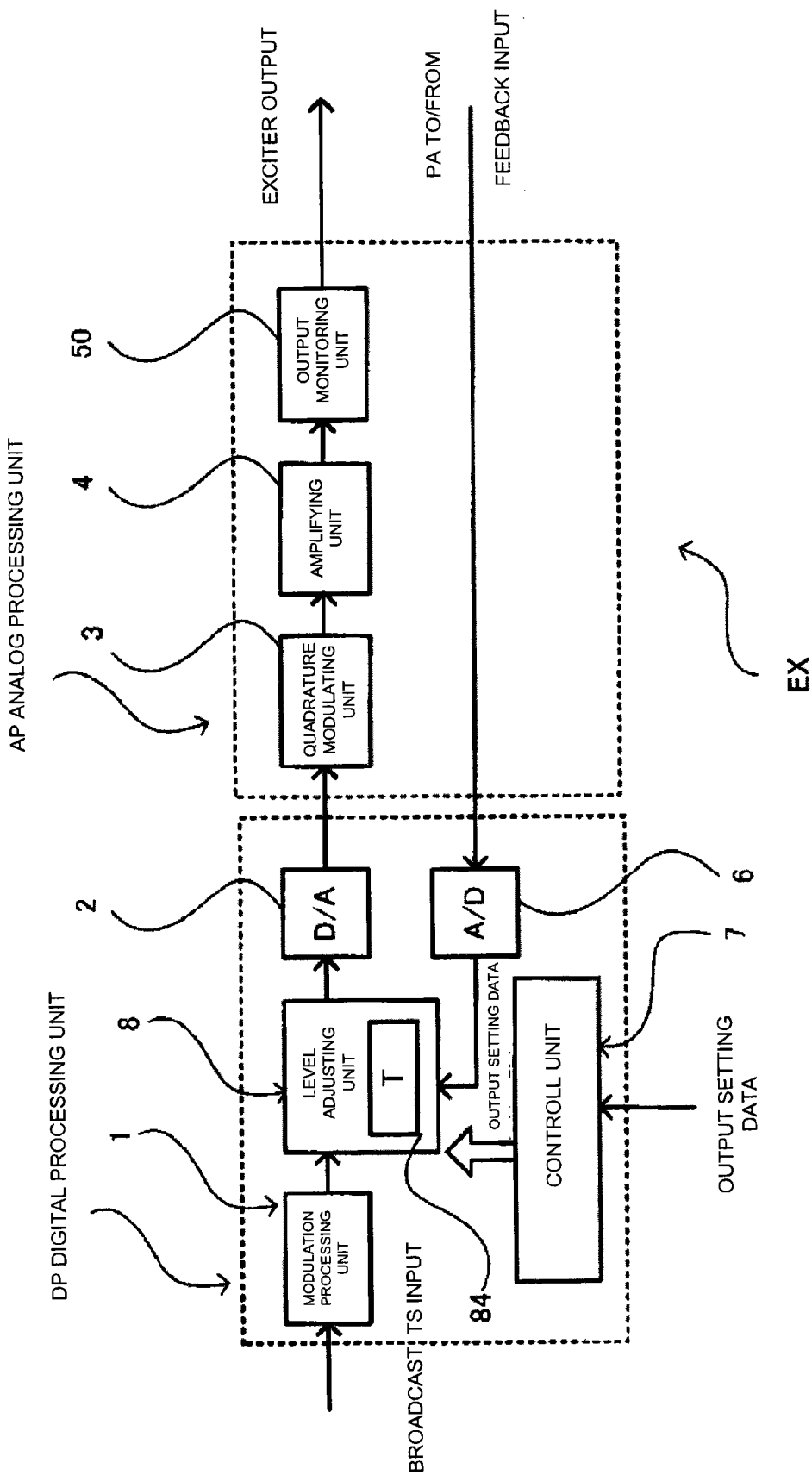
FIG. 5A is a functional block diagrams of an exciter according to a third embodiment.
Figure 5B:
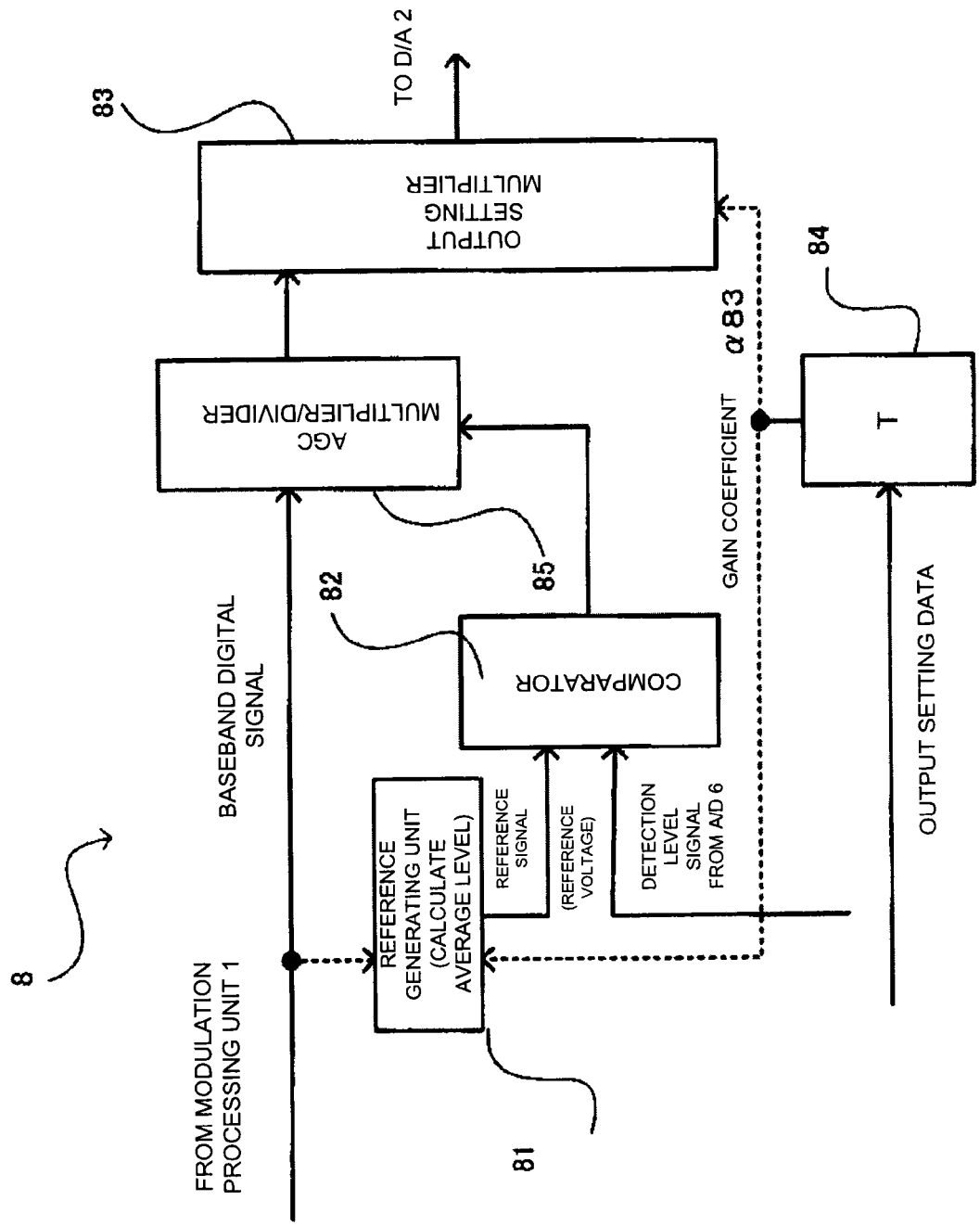
FIG. 5B is a functional block diagram of a level adjusting unit in FIG. 5A.

FIG. 5A is a functional block diagram of an exciter according to third embodiment, and FIG. 5B is a functional block diagram for explaining an operation of a level adjusting unit 8 of the exciter according to the third embodiment. The present embodiment is the same as the second embodiment except for a configuration and the operation of the level adjusting unit 8, and therefore overlapping description will be omitted.

In FIG. 5A, a feedback signal from a power amplifier is input to a high speed A/D 6 without being detected, and an average value of the feedback signal is calculated based on a digital signal. In the present embodiment, it is possible to provide an advantage that, by performing computation processing, a control unit 7 can freely set a response time corresponding to a rectification response time (time constant) determined by a circuit constant of an original detection circuit 5.

Figure 6:
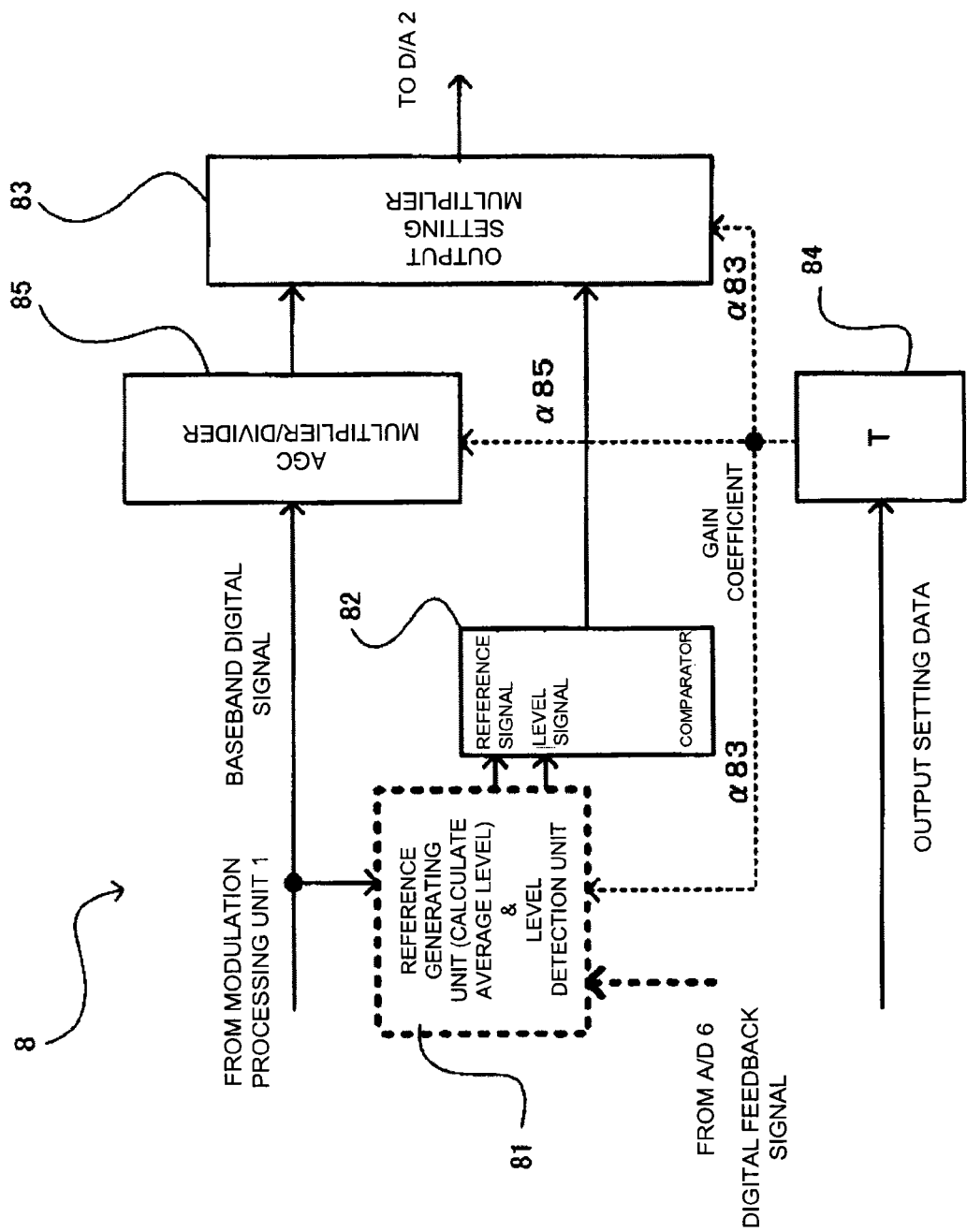
FIG. 6 is a functional block diagram of an exciter showing a modified example of the third embodiment.

FIG. 6 is a functional block diagram of an exciter according to a modified example of the third embodiment. FIG. 5B illustrates two average level calculating functional units. However, a baseband digital signal and a digital feedback signal may be input to an average level calculating functional unit obtained by combining the average level calculating functional units into one likewise the modified example of the third embodiment via a data bus, and may be time-multiplexed to calculate an average level thereof.

A conventional exciter feeds back an output level from an amplifier of an analog processing unit including quadrature modulation processing, and an attenuator adjusts a level such that the output level takes a reference value in an analog circuit at a final stage of the exciter. By contrast with this, in the present embodiment, feedback correction is performed on a digital baseband of a broadcast TS signal by gain adjustment calculated digitally, without using an attenuator. Consequently, it is possible to realize AGC with a smaller circuit scale and lower consumption power than the conventional example.

According to an exciter of a broadcast transmitting facility of at least one of the above embodiments, a feedback signal for a monitor of a power amplifier is digital converted, a digital converted feedback signal is input to the exciter and the exciter digitally adjusts amplitude. Consequently, it is possible to provide a digital broadcast transmitting device that saves power and saves a space, and has an AGC function of easily setting various types of output levels.

Some embodiments of the present invention have been described. However, the embodiments have been presented by way of example only and do not intend to limit the scope of the invention. These embodiments may be embodied in other various modes, and may be variously omitted, replaced and changed without departing from the spirit of the invention.

These embodiments and modifications thereof are incorporated in the scope and the spirit of the invention and are likewise incorporated in a scope of the invention recited in the claims and equivalent thereof.

What is claimed is:

1. A digital broadcast transmitting device which converts a broadcast Transport Stream (TS) signal to be input, into a signal of a digital broadcast radio wave format which is subjected to quadrature modulation, supplies the signal to a power amplifier, and transmits from an antenna a broadcast radio signal amplified by the power amplifier, the digital broadcast transmitting device comprising:
   a power amplifier which outputs part of a transmitted broadcast radio signal as a feedback signal;
   a controlling means which sends out output setting data for setting an output level of the broadcast radio wave;
   an A/D converter means which receives an input of the feedback signal, and outputs an input feedback signal as an A/D-converted level signal;
   a converting means which converts the broadcast TS signal to be input, into a baseband digital signal, and outputs the baseband digital signal;
   a level adjusting means which includes
      a reference generating means which receives an input of the level signal, the baseband digital signal and the output setting data, and generates and outputs a reference voltage corresponding to the output setting data,
      a comparing means which receives an input of the reference voltage and the level signal, and outputs a difference between the reference voltage and the level signal as an error signal,
      an AGC multiplying/dividing means which receives an input of the error signal and the baseband digital signal, multiplies or divides the baseband digital signal with or by an internal gain coefficient such that the error signal becomes 0, converts a multiplication/division result into an AGC baseband signal, and outputs the AGC baseband signal, and
      an output adjusting means which multiplies the AGC baseband digital signal with an output gain coefficient based on the output setting data, converts a multiplication result into a digital signal corresponding to the output level of the broadcast radio wave, and outputs the digital signal; and
   an exciter which includes
      a D/A converter means which D/A-converts the digital signal output from the level adjusting means, into a baseband analog signal, and outputs the baseband analog signal, and
      an analog processing unit which performs quadrature modulation on a D/A-converted signal to be input, amplifies the D/A-converted signal, converts the signal into an exciter signal which is a radio frequency signal of a broadcast radio wave format, and outputs the exciter signal.

2. The digital broadcast transmitting device according to claim 1, wherein
   the exciter further includes a detecting means which detects and rectifies the feedback signal,
   the A/D converter means receives an input of a detected and rectified feedback signal, A/D-converts the detected and rectified feedback signal into the level signal, and outputs the level signal, and
   the reference generating means outputs a reference voltage of a direct current signal.

3. The digital broadcast transmitting device according to claim 1, wherein
   the exciter further includes a detecting means which detects and rectifies the feedback signal,
   the A/D converter means receives an input of a detected and rectified feedback signal, A/D-converts the detected and rectified feedback signal into the level signal, and outputs the level signal,
   the reference generating means receives an input of the baseband digital signal output from the converting means, calculates an average level of an input signal, and generates and outputs the reference voltage, and
   the comparing means outputs the difference between the level signal and the reference voltage.

4. The digital broadcast transmitting device according to claim 1, wherein
   the exciter further includes an average level calculating means which calculates an average level of an A/D-converted feedback signal, and outputs an average feedback level signal,
   the reference generating means receives an input of the baseband digital signal output from the converting means, calculates an average level of an input signal, generates the reference voltage and outputs the reference voltage, and the comparing means outputs a difference between the average feedback level signal and the reference voltage.

5. A digital broadcast transmitting device which converts a broadcast Transport Stream (TS) signal to be input, into a signal of a digital broadcast radio wave format which is subjected to quadrature modulation, supplies the signal to a power amplifier, and transmits from an antenna a broadcast radio signal amplified by the power amplifier, the digital broadcast transmitting device comprising:
   a power amplifier which outputs part of a transmitted broadcast radio signal as a feedback signal;
   a controlling means which sends out output setting data for setting an output level of the broadcast radio wave;
   an A/D converter means which receives an input of the feedback signal, and outputs an input feedback signal as an A/D-converted level signal;
   a converting means which converts the broadcast TS signal to be input, into a baseband digital signal, and outputs the baseband digital signal;
   a level adjusting means which includes
      a reference generating means which receives an input of the level signal, the baseband digital signal and the output setting data, and generates and outputs a reference voltage corresponding to the output setting data,
      a comparing means which receives an input of the reference voltage and the level signal, and outputs a difference between the reference voltage and the level signal as an error signal,
      an output adjusting means which multiplies the baseband digital signal with an output gain coefficient based on the output setting data, converts a multiplication result into an adjusted baseband digital signal corresponding to the output level of the broadcast radio wave, and outputs the adjusted baseband digital signal, and
      an AGC multiplying/dividing means which receives an input of the difference signal and the adjusted baseband digital signal, generates a digital signal obtained by multiplying or dividing the baseband digital signal with or by an internal gain coefficient such that the error signal becomes 0, and outputs the digital signal; and
   an exciter which includes
      a D/A converter means which D/A-converts the digital signal output from the level adjusting means, into a baseband analog signal, and outputs the baseband analog signal, and
      an analog processing unit which converts a D/A-converted signal to be input, into an exciter signal which is a radio frequency signal of a broadcast radio wave format which is subjected to quadrature modulation and amplified, and outputs the exciter signal.

6. An exciter of a digital broadcast transmitting device which converts a broadcast Transport Stream (TS) signal to be input, into a signal of a digital broadcast radio wave format which is subjected to quadrature modulation, supplies the signal to a power amplifier, transmits from an antenna a broadcast radio signal amplified by the power amplifier, and receives an input of part of a transmitted broadcast radio signal as a feedback signal, the exciter comprising:
   a controlling means which send out output setting data for setting an output level of an exciter signal corresponding to an output level of the broadcast radio wave;
   an A/D converter means which receives an input of the feedback signal, and outputs an input feedback signal as an A/D-converted level signal;
   a converting means which converts the broadcast TS signal to be input, into a baseband digital signal, and outputs the baseband digital signal;
   a level adjusting means which includes
      a reference generating means which receives an input of the level signal, the baseband digital signal and the output setting data, and generates and outputs a reference voltage corresponding to the output setting data,
      a comparing means which receives an input of the reference voltage and the level signal, and outputs a difference between the reference voltage and the level signal as an error signal,
      an AGC multiplying/dividing means which receives an input of the error signal and the baseband digital signal, multiplies or divides the baseband digital signal with or by an internal gain coefficient such that the error signal becomes 0, converts a multiplication/division result into an AGC baseband digital signal, and outputs the AGC baseband digital signal, and
      an output adjusting means which multiplies the AGC baseband digital signal with an output gain coefficient based on the output setting data, converts a multiplication result into a digital signal corresponding to the output level of the broadcast radio wave, and outputs the digital signal;
   a D/A converter means which D/A-converts the digital signal output from the level adjusting means, into a baseband analog signal, and outputs the baseband analog signal; and
   an analog processing unit which converts a D/A-converted signal to be input, into an exciter signal which is subjected to quadrature modulation and amplified, and outputs the exciter signal.

* * * * *